(12) United States Patent
Kubota

(10) Patent No.: US 7,727,783 B2
(45) Date of Patent: Jun. 1, 2010

(54) METHOD OF MEASURING MINORITY CARRIER DIFFUSION LENGTH AND METHOD OF MANUFACTURING SILICON WAFER

(75) Inventor: Tsuyoshi Kubota, Saga (JP)

(73) Assignee: Sumco Corporation, Tokyo (JP)

( * ) Notice: Subject to any disclaimer, the term of this patent is extended or adjusted under 35 U.S.C. 154(b) by 495 days.

(21) Appl. No.: 11/697,796

(22) Filed: Apr. 9, 2007

(65) Prior Publication Data

US 2007/0287205 A1    Dec. 13, 2007

(30) Foreign Application Priority Data

Apr. 11, 2006    (JP) .............................. 2006-108406

(51) Int. Cl.
  *H01L 21/66*    (2006.01)
  *H01L 21/469*   (2006.01)
  *H01L 21/00*    (2006.01)

(52) U.S. Cl. .......................... 438/17; 438/787; 438/788; 438/795; 257/E21.531

(58) Field of Classification Search ................... 438/17, 438/788, 789, 795; 257/E21.531
  See application file for complete search history.

(56) References Cited

U.S. PATENT DOCUMENTS

| | | | | |
|---|---|---|---|---|
| 4,973,563 A | * | 11/1990 | Prigge et al. ................. | 438/692 |
| 5,742,176 A | * | 4/1998 | Kato et al. ................... | 324/765 |
| 6,013,556 A | * | 1/2000 | Higashi et al. .............. | 438/402 |
| 6,168,961 B1 | * | 1/2001 | Vaccari ........................ | 438/16 |
| 6,511,921 B1 | * | 1/2003 | Panczyk et al. ............. | 438/770 |
| 2005/0064064 A1 | | 3/2005 | Ickinger | |
| 2006/0279311 A1 | * | 12/2006 | Steeples ..................... | 324/765 |
| 2007/0105344 A1 | * | 5/2007 | Uchida et al. ............... | 438/459 |

FOREIGN PATENT DOCUMENTS

| | | |
|---|---|---|
| JP | 6-069301 | 3/1994 |
| JP | 8-064650 | 3/1996 |

OTHER PUBLICATIONS

English Language Abstract of JP 6-069301, Mar. 11, 1994.
English Language Abstract of JP 8-064650, Mar. 8, 1996.

* cited by examiner

*Primary Examiner*—Hsien-ming Lee
*Assistant Examiner*—Kevin Parendo
(74) *Attorney, Agent, or Firm*—Greenblum & Bernstein, P.L.C.

(57) ABSTRACT

A method of measuring a diffusion length of a minority carrier in a silicon wafer by a surface photovoltage method including irradiating the surface-treated silicon wafer with ultraviolet radiation in an oxygen-containing atmosphere, and measuring a diffusion length of a minority carrier in a silicon wafer by a surface photovoltage method.

9 Claims, 5 Drawing Sheets

Intentionally contaminated wafer

Fig. 1(a) Intentionally contaminated wafer
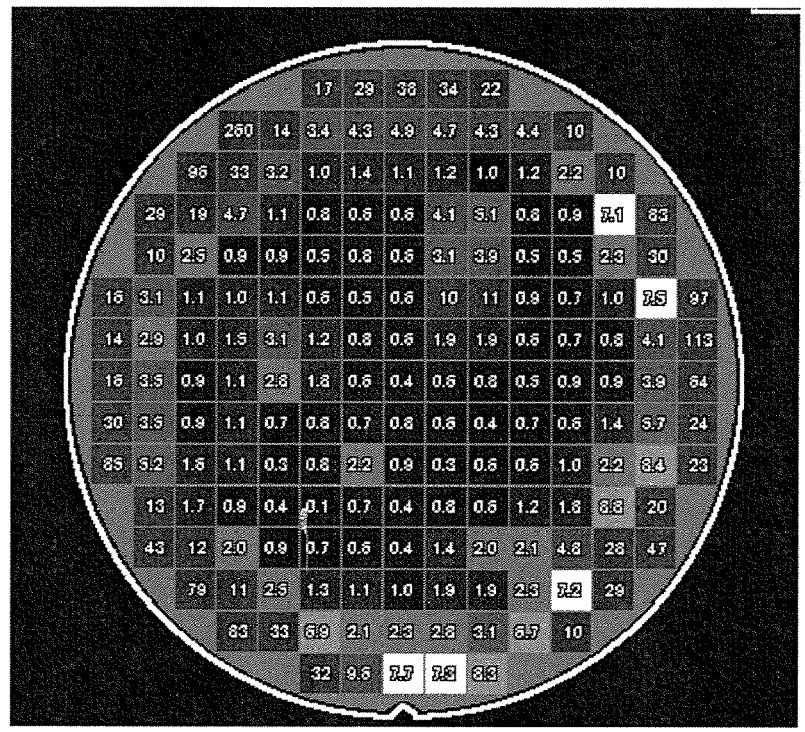
Fig. 1(b) Polished wafer
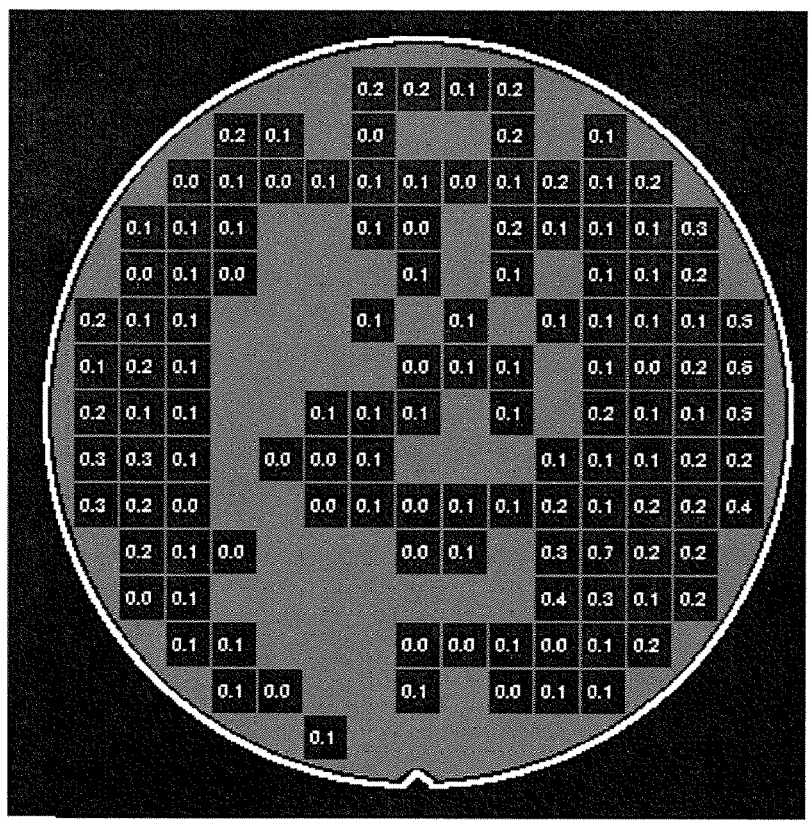

Fig. 1(c) Etching wafer
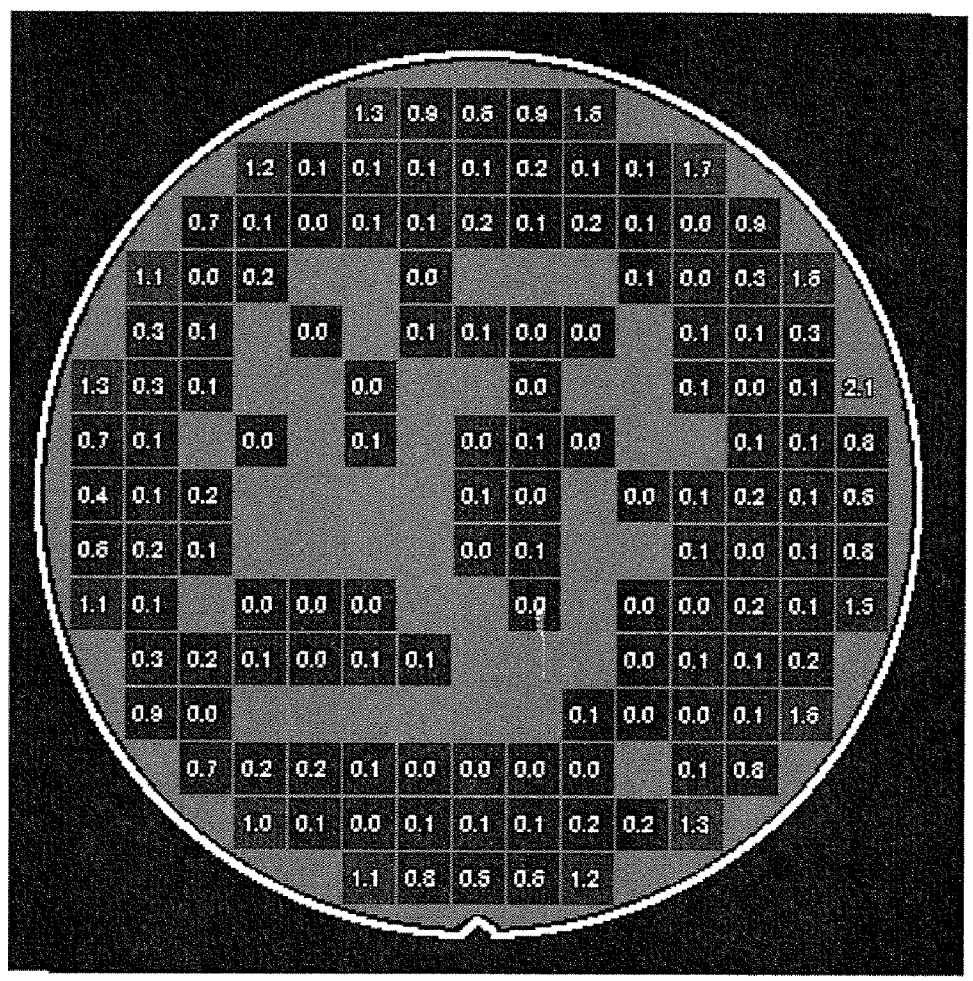

Fig. 2(a) Intentionally contaminated wafer
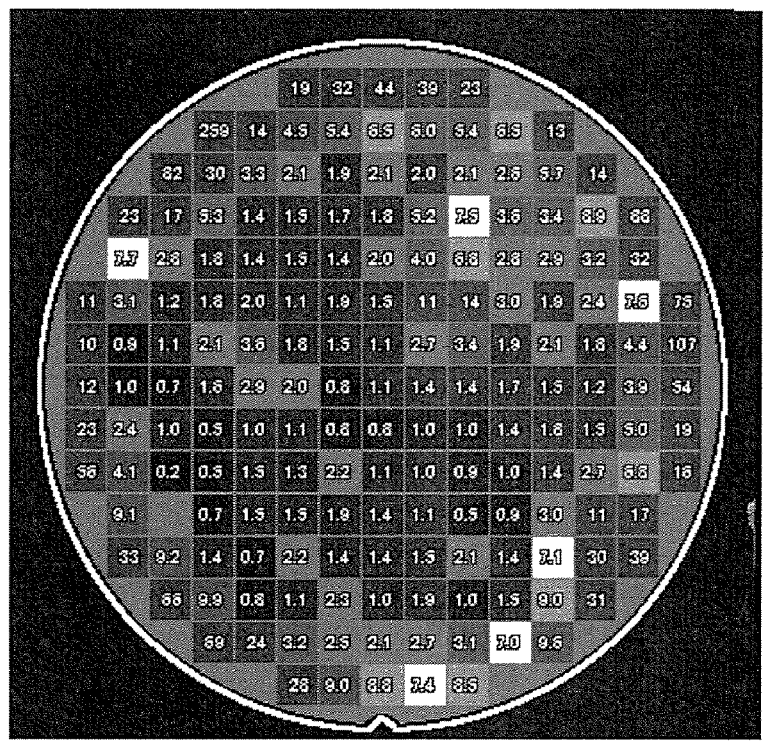
Fig. 2(b) Polished wafer
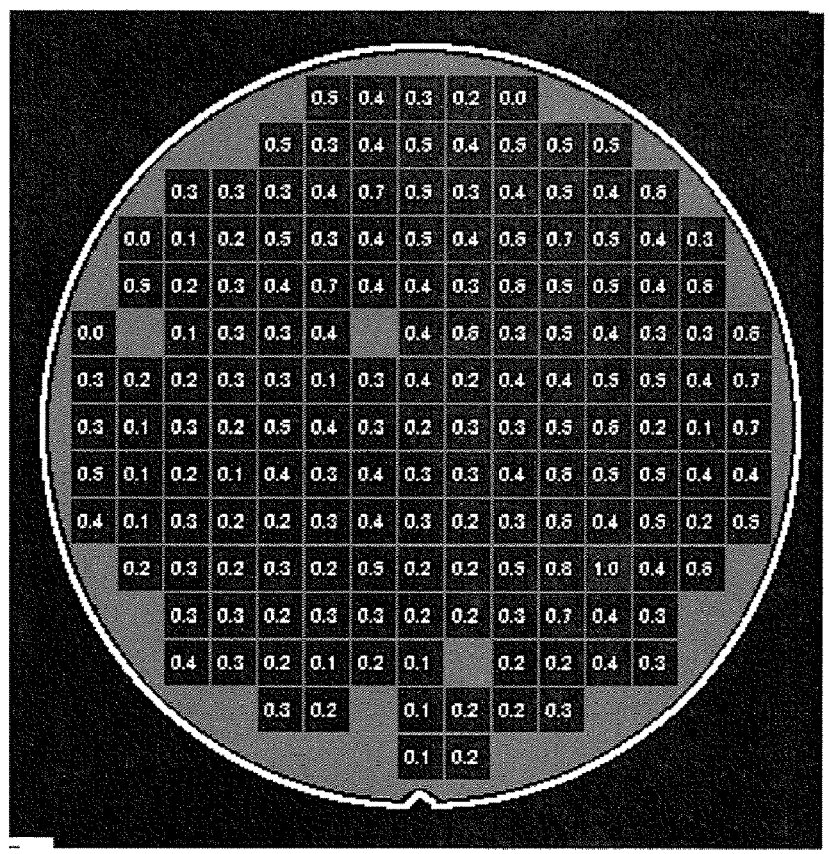

Fig. 2(c) Etching wafer
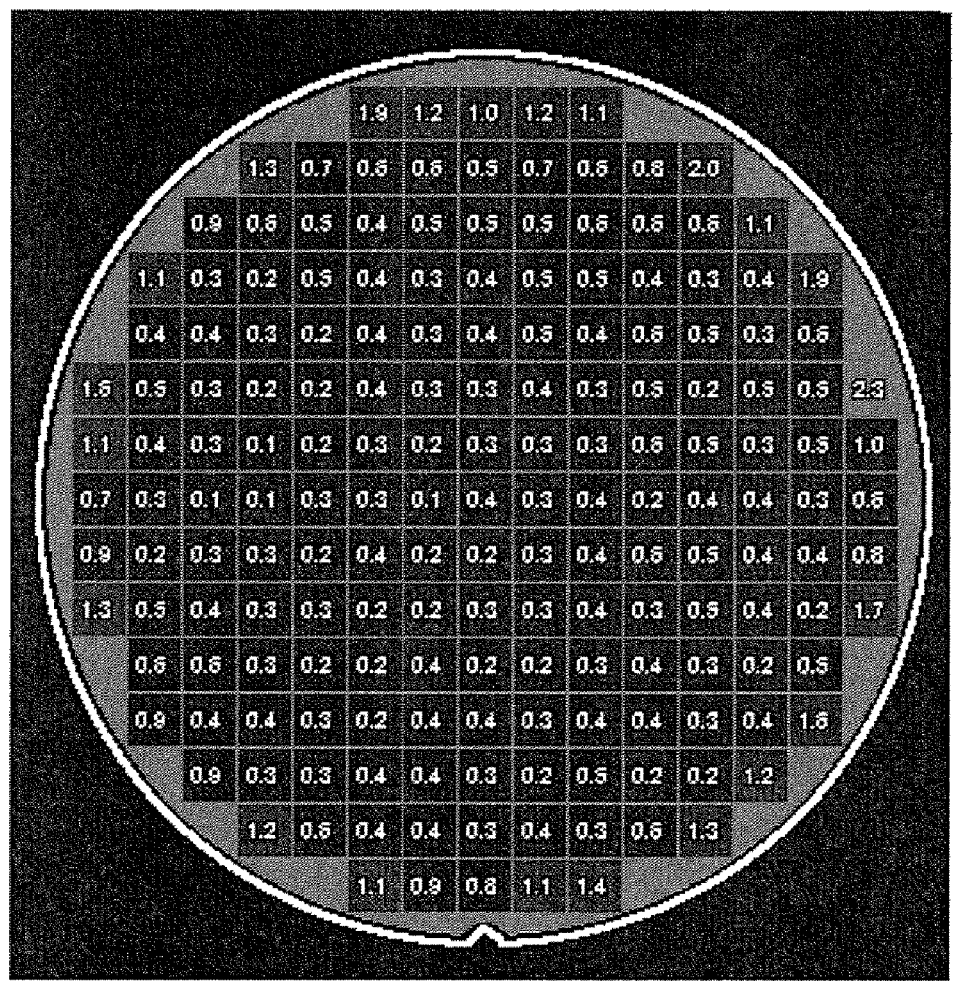

Fig. 3(a) 1 hour after HF treatment
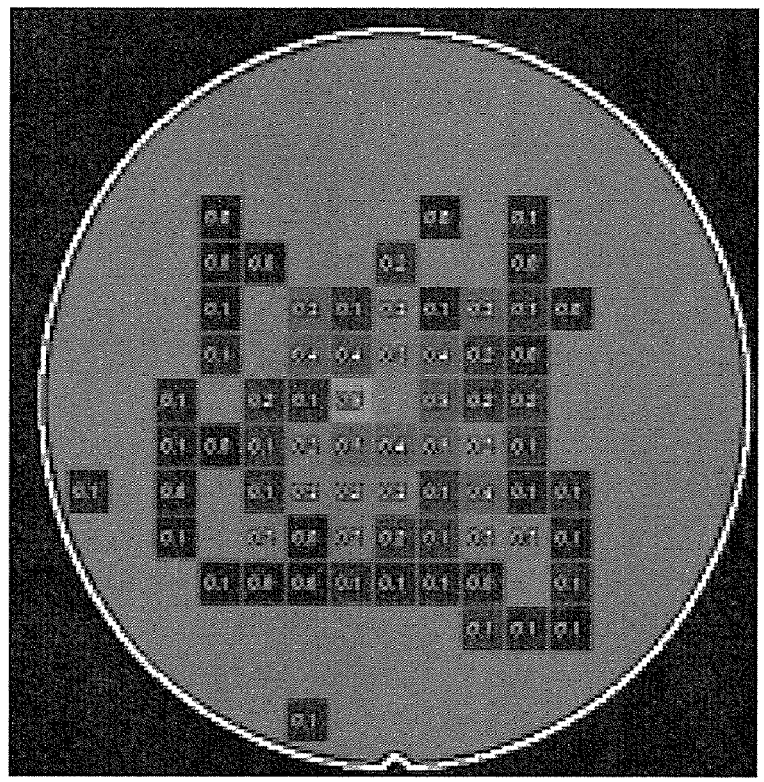
Fig. 3(b) 24 hours after HF treatment
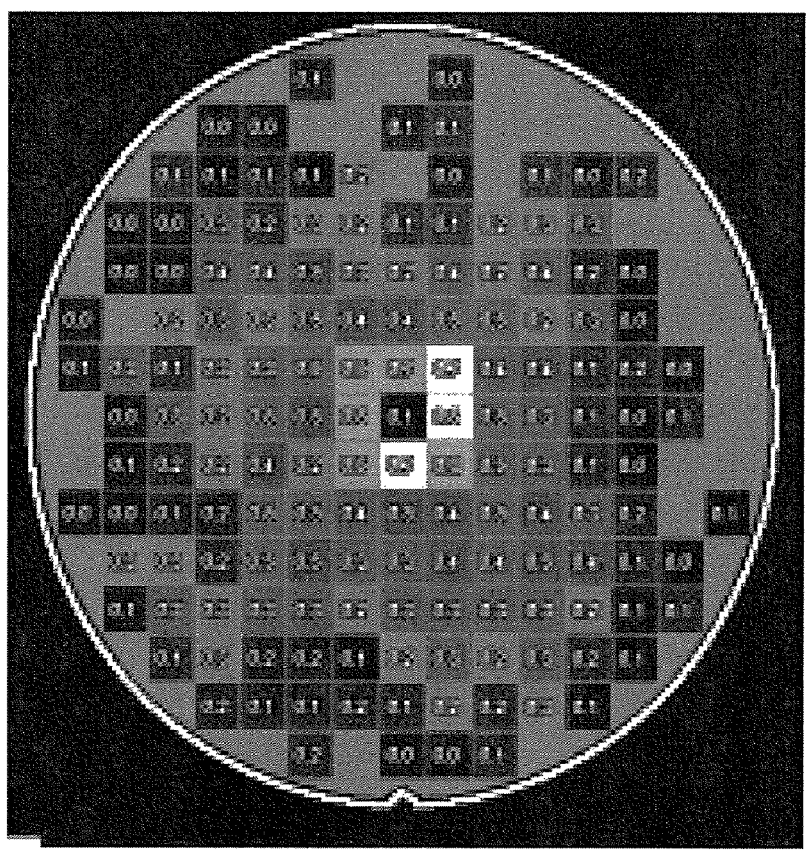

METHOD OF MEASURING MINORITY CARRIER DIFFUSION LENGTH AND METHOD OF MANUFACTURING SILICON WAFER

CROSS-REFERENCE TO RELATED APPLICATIONS

This application claims benefit of priority under 35 USC 119 to Japanese Patent Application No. 2006-108406 filed on Apr. 11, 2006, which is expressly incorporated herein by reference in its entirety.

BACKGROUND OF THE INVENTION

1. Field of the Invention

The present invention relates to a method permitting the rapid and highly precise measurement of the minority carrier diffusion length in a silicon wafer by stabilizing the silicon wafer surface shortly following surface treatment in the course of measuring the minority carrier diffusion length by the surface photovoltage method; and to a method of manufacturing a silicon wafer using this method.

2. Discussion of the Background

Typically, when crystal defects are present in silicon wafers (also referred to hereinafter as "wafers") or wafers are contaminated with metal impurities, the device characteristics of the finished product are negatively affected. Thus, the measurement of electrical properties such as the recombination lifetime and the diffusion length of the minority carrier within the wafer has been proposed, to facilitate the evaluation of such defects and contaminants.

In the evaluation of electrical properties, the evaluation of diffusion length by the surface photovoltage (SPV) method is widely employed to assess high levels of contamination by metals deep within the wafer, such as iron (see Japanese Unexamined Patent Publication (KOKAI) Heisei No. 6-69301, which is expressly incorporated herein by reference in its entirety). The SPV method is a good measurement method in that it allows rapid, non-contact measurement without damaging the wafer.

A summary of the method of measuring the minority carrier diffusion length in a silicon wafer by the SPV method is given below.

First, the silicon wafer is surface-treated (surface charge treated). In the case of a p-type wafer, the surface treatment is conducted by immersing the silicon wafer in hydrofluoric acid (HF) for a prescribed period of time. This surface treatment produces band bending near the surface. In this state, minority carriers excited by irradiation through the silicon surface by light having an energy level greater than the band gap of the silicon can be collected at the surface by the electric field caused by band bending, producing a surface photovoltage (SPV). When the number of carriers injected by the light is not so large (generally 1E10 to $1E13/cm^3$), a surface photovoltage is generated in proportion to the excess minority carrier density at the surface. When the wavelength of the light being irradiated is changed, the density of the minority carrier being generated, that is, the SPV value, changes with the penetration depth of the light (coefficient of light absorption $\alpha$ (alpha)). A quantity of light is selected at which the relation between the quantity of light ($\phi$(phi)F), SPV, and coefficient of light absorption $\alpha$ at various wavelengths is $\phi F/SPV \propto 1/\alpha$. Once this relation has been plotted, the minority carrier diffusion length can be obtained as the point of intersection with the $1/\alpha$ axis at $\phi F/SPV=0$.

When the wafer contains metal impurities, the minority carrier diffusion length typically decreases. However, when a metal impurity such as iron (Fe) is contained, for example, in a boron-doped p-type silicon wafer, electrostatic forces cause Fe to pair off with boron in Fe—B pairs. As a result, there is almost no effect on the minority carrier diffusion length. By contrast, when the silicon wafer surface is irradiated with light to dissociate pairs (such as Fe—B pairs) forming between dopants and contaminant metals, Fe does affect the minority carrier diffusion length and the minority carrier diffusion length decreases. The presence and concentration of contaminant metals can be determined based on such differences in minority carrier diffusion length before and after dissociation treatment.

However, the wafer surface is not stable immediately following the above surface treatment. Thus, it is impossible to obtain accurate measurements when the diffusion length is measured immediately following surface treatment. For this reason, a wafer will normally be left standing for a prescribed period of time after surface treatment, with measurement being conducted once the wafer surface has stabilized. However, several hours are normally required for the wafer surface to stabilize, precluding rapid measurement. Further, it is difficult to determine how long a wafer must be left standing before the wafer surface will stabilize. There is also a problem in that highly reliable data cannot be obtained when measurement is conducted with the wafer surface in a state of inadequate stabilization.

SUMMARY OF THE INVENTION

A feature of the present invention provides for a means of measuring the minority carrier diffusion length in a silicon wafer rapidly and with high reliability.

The present invention provides a method of measuring a diffusion length of a minority carrier in a silicon wafer by a surface photovoltage method, wherein the measurement is carried out after surface-treating the silicon wafer and irradiating the surface-treated silicon wafer with ultraviolet radiation in an oxygen-containing atmosphere.

In one embodiment, the silicon wafer has an oxide film on its surface after the irradiation with ultraviolet radiation.

In one embodiment, oxide film on the surface of the silicon wafer has a thickness ranging from approximately 1 to approximately 3 nm.

In one embodiment, the irradiation with ultraviolet radiation is carried out after depositing a carbon-containing compound on the surface of the silicon wafer that has been surface-treated.

In one embodiment, the ultraviolet radiation has a wavelength ranging from approximately 100 to approximately 380 nm.

In one embodiment, the ultraviolet radiation has an energy ranging from approximately 100 to approximately 800 kJ/mol.

In one embodiment, the silicon wafer is a p-type silicon wafer.

In one embodiment, the surface treatment is a hydrofluoric acid treatment.

In one embodiment, wherein the silicon wafer is a silicon wafer which is doped with boron and includes a contaminant metal in the form of iron.

In one embodiment, the oxygen concentration of the oxygen-containing atmosphere ranging ranges from approximately 5 to approximately 100 volume percent.

The present invention provides a method of manufacturing a silicon wafer, including:

surface-treating a silicon wafer, measuring a diffusion length of a minority carrier in the surface-treated silicon wafer by a surface photovoltage method including, irradiating the surface-treated silicon wafer with ultraviolet radiation in an oxygen-containing atmosphere, and measuring the diffusion length of a minority carrier in the silicon wafer, calculating the concentration of contaminant metal from the measured diffusion length of the minority carrier, and selecting a silicon wafer of which concentration of contaminant metal that has been calculated is equal to or less than a target value.

The present invention permits the rapid, highly reliable measurement of the minority carrier diffusion length in a silicon wafer by early stabilization of the silicon wafer surface following surface treatment in the course of measuring the minority carrier diffusion length in a silicon wafer by the SPV method.

Other exemplary embodiments and advantages of the present invention may be ascertained by reviewing the present disclosure and the accompanying drawings.

BRIEF DESCRIPTION OF THE DRAWINGS

The present invention will be described in the following text by the exemplary, non-limiting embodiments shown in the figures, wherein:

FIGS. 1(a)-1(c) show a map of the Fe concentration obtained by SPV measurement in Comparative Example 1.

FIGS. 2(a)-2(c) show a map of the Fe concentration obtained by SPV measurement in Example 1.

FIGS. 3(a)-3(b) show maps of Fe concentrations obtained by SPV measurement 1 hour and 24 hours after HF treatment in Comparative Example 2.

DESCRIPTIONS OF THE EMBODIMENTS

The following preferred specific embodiments are, therefore, to be construed as merely illustrative, and not limitative of the remainder of the disclosure in any way whatsoever. In this regard, no attempt is made to show structural details of the present invention in more detail than is necessary for the fundamental understanding of the present invention, the description taken with the drawings making apparent to those skilled in the art how the several forms of the present invention may be embodied in practice.

The present invention relates to a method of measuring a diffusion length of a minority carrier in a silicon wafer by a surface photovoltage method. In the measuring method of the present invention, the measurement of the diffusion length can be carried out after surface-treating the silicon wafer and irradiating the surface-treated silicon wafer with ultraviolet radiation in an oxygen-containing atmosphere.

In the SPV method, the surface of the silicon wafer is treated (with a surface charge treatment) prior to measurement of the minority carrier diffusion length. However, since the wafer surface is typically unstable immediately after this surface treatment, accurate measurement values cannot be obtained if the diffusion length is measured immediately following surface treatment. Further, it is difficult to determine how long the wafer must be left standing following surface treatment before highly reliable measurement will become possible. Thus, there is a problem in that highly reliable data cannot be obtained when measurement is conducted with the wafer surface in a state of inadequate stabilization.

By contrast, in the measuring method of the present invention, the silicon wafer surface is irradiated with ultraviolet radiation in an oxygen-containing atmosphere following surface treatment. Thus, the wafer surface can be rapidly stabilized following surface treatment and the measurement time can be reduced. Further, an advantage is afforded in that highly reliable data can be obtained because measurement is conducted with the surface in a stabilized state. Although not wanting to be bound by any particular theory, this is thought to be due to the generation of ozone and thus the formation of a thin oxide film on the surface of the wafer as a result of irradiation with ultraviolet radiation in an oxygen-containing atmosphere.

The concentration of the oxygen in the above oxygen-containing atmosphere is, for example, approximately 5 to approximately 100 volume percent, preferably approximately 15 to approximately 80 volume percent. The oxygen-containing atmosphere may be air, for example. This atmosphere may contain nitrogen, argon, and the like in addition to oxygen. The irradiation with ultraviolet radiation can be conducted under the following conditions. By way of example, ultraviolet radiation with a wavelength of approximately 100 to approximately 380 nm, preferably approximately 150 to approximately 260 nm, is employed. The energy of this radiation is approximately 100 to approximately 800 kJ/mol, preferably greater than or equal to the oxygen bond energy (i.e., approximately 140 kJ/mol). By way of example, the duration of ultraviolet irradiation is from approximately 15 to approximately 75 seconds, preferably approximately 30 to approximately 45 seconds. By keeping the oxygen concentration in the ultraviolet irradiation atmosphere within the range given in the ultraviolet irradiation conditions, the wafer surface can be rapidly stabilized following surface treatment.

The above surface treatment is conducted to form a hole-poor layer or inversion layer in the vicinity of the wafer surface in order to measure the minority carrier diffusion length by the SPV method. To form the hole-poor layer or inversion layer, a charge of the same code as the majority carrier is imparted to the wafer surface. For example, in the above surface treatment, an n-type silicon wafer is treated by boiling the wafer in an $H_2O_2$ aqueous solution, and a p-type silicon wafer is treated by treating the wafer with HF or by a thermal oxidation treatment. By way of example, the HF treatment can be conducted by immersing the silicon wafer for approximately 1 to approximately 10 minutes in HF (for example, approximately 0.5 to approximately 50 weight percent HF), washing the silicon wafer with pure water, and spin drying. Since the above surface treatment positively charges the surface of a p-type silicon wafer, a hole-poor layer or inversion layer can be formed in the vicinity of the surface of the silicon wafer. The above thermal oxidation treatment can be conducted by a known method. The measuring method of the present invention can be applied to both n-type and p-type wafers. Application to p-type silicon wafers is desirable, and application to HF-treated p-type silicon wafers is preferred.

Boron-doped and gallium-doped, preferably boron-doped, silicon wafers can be employed as p-type silicon wafers. By way of example, the level of doping can be approximately $4 \times 10^{13}$ to approximately $3 \times 10^{18}$ atoms/cm$^3$. The resistivity of the silicon wafer can be, for example, approximately 0.03 to approximately 300 $\Omega$(ohms)·cm. Such a silicon wafer can be manufactured by known methods. The above minority carriers are electrons in a p-type wafer and positive holes in an n-type wafer. Contaminant metals in a wafer may be iron, nickel, and copper. The measuring method of the present invention is desirably applied to wafers containing a contaminant metal in the form of iron to evaluate the level of contamination from the minority carrier diffusion length.

In the measuring method of the present invention, irradiation with ultraviolet radiation is conducted in an oxygen-containing atmosphere following the above-described surface treatment. To enhance the stability of the wafer surface following surface treatment, it is desirable to deposit a carbon-containing compound (also referred to as a "carbon deposition treatment" hereinafter) to the wafer surface prior to irradiation with ultraviolet radiation. In irradiation with ultraviolet radiation in an oxygen-containing atmosphere, the ultraviolet radiation can decompose oxygen molecules into oxygen atoms, forming a thin oxide film (for example, about 0.5 to about 3 nm, preferably about 1 to about 3 nm). In this process, when a carbon-containing compound has been deposited in advance, a carbon-containing oxide film is formed, and a stable positive charge (for example, approximately 0.1 V or above, preferably approximately 0.15 to approximately 0.5 V) can be imparted. This further enhances the stability of the wafer surface following surface treatment.

The carbon-containing compound is not specifically limited other than that it contain carbon. For example, ethylene glycol and p-tert-octylphenoxy polyethyl may be employed. The carbon-containing compounds may be employed singly or in combinations of two or more.

The carbon deposition treatment can be conducted by coating and drying a solution of the carbon-containing compound on the wafer surface following surface treatment. Such solutions can be prepared by dissolving the carbon-containing compound in a suitable solvent such as water or alcohol. As needed, other components such as surfactants may also be added to the solution. It suffices to determine the concentration of the carbon-containing compound in the solution based on the quantity of carbon-containing compound, the charge state, and the like desired on the wafer surface. Solutions containing commercially available carbon-containing compounds may be employed as the above solution.

The period elapsing between the end of the above surface treatment and the start of the ultraviolet irradiation treatment (preferably a carbon deposition treatment and ultraviolet irradiation treatment) is not specifically limited. However, for the ultraviolet irradiation treatment to more rapidly stabilize the wafer surface following surface treatment, it is desirably conducted soon after the surface treatment.

In one embodiment of the present invention, the SPV method is used to measure the minority carrier diffusion length in the silicon wafer that has been subjected to the above-described ultraviolet irradiation treatment. Since the wafer surface can be rapidly stabilized following surface treatment by the above-described ultraviolet irradiation treatment, the wafer can be immediately subjected to measurement following the above-described ultraviolet irradiation.

SPV measurement of the diffusion length may be conducted with a known SPV device, such as, for example, a FAaST 330 made by Semiconductor Diagnostics Inc. (SDI). Measurement of the diffusion length is desirably conducted at several points within the surface to increase measurement reliability.

To analyze the contaminant metals in the wafer by diffusion length measurement by the SPV method, following the above-described surface treatment, pairs of dopants and contaminant metals (such as Fe—B pairs) in the wafer are typically dissociated by photoirradiation or heating. Dissociation processing can be conducted by intermittently irradiating the silicon wafer surface with monochromatic light having an energy greater than or equal to the forbidden band energy of 1.1 eV of the silicon wafer, or by maintaining the silicon wafer for about 5 to about 15 minutes in an atmosphere of approximately 200 degrees Celsius or greater and then cooling it (for example, at a cooling rate of approximately 0.1 to approximately 3.0 degrees Celsius/second). Once this dissociation treatment causes the dissociation of Fe—B pairs, the Fe begins to affect the minority carrier diffusion length. Thus, it becomes possible to determine whether or not contaminant metals (Fe and the like) are present in the wafer, and their concentrations, from differences in the minority carrier diffusion length before and after the dissociation treatment. A known method may be employed to determine the concentration of contaminant metals from the diffusion lengths measured by the SPV method. Specifically, the methods described in Japanese Unexamined Patent Publication (KOKAI) Heisei No. 6-69301, Heisei No. 8-64650 or English language family member U.S. Pat. No. 5,742,176, and No. 2005-64064, which are expressly incorporated herein by reference in their entirety, may be employed. Since the function of calculating the Fe concentration in a wafer from the minority carrier diffusion lengths before and after photodissociation is built into ordinary SPV devices, the concentration of Fe in the wafer can be determined from the above diffusion length measurements.

The present invention further relates to a method of manufacturing a silicon wafer, including:

surface-treating a silicon wafer, measuring a diffusion length of a minority carrier in the surface-treated silicon wafer by a surface photovoltage method, calculating the concentration of contaminant metal from the measured diffusion length of the minority carrier, and selecting a silicon wafer of which concentration of contaminant metal that has been calculated is equal to or less than a target value, wherein the above measurement of the diffusion length is carried out by the measuring method of the present invention.

Based on the method of measuring the minority carrier diffusion length of the present invention as set forth above, the time required for measurement can be reduced and operating efficiency can be enhanced because the surface of the silicon wafer can be stabilized soon after surface treatment with HF or the like. Since it is difficult to determine the time required for the surface of the silicon wafer to stabilize following surface treatment in usual methods, there is a problem in that measurement precision drops when measurement is conducted prior to stabilization. By contrast, based on the measuring method of the present invention, highly reliable data can be obtained because the wafer surface can be rapidly stabilized following surface treatment by means of the above-described ultraviolet irradiation treatment. Further, in the method of manufacturing a silicon wafer of the present invention, highly reliable data can be rapidly obtained by measuring the minority carrier diffusion length in the silicon wafer by the above-described method, thereby providing high-quality wafers with high productivity. The method of determining the concentration of contaminant metals from the diffusion length measured by the SPV method has been already stated above. Thus, the concentration of contaminant metals (such as iron) in the silicon wafer can be determined and silicon wafers having a concentration of contaminant metals less than or equal to a prescribed target value can be selected to obtain high-quality silicon wafers containing little metal contamination. The target value of contaminant metal concentration can be set in consideration of the physical properties required of the wafer based on the wafer application or the like.

EXAMPLES

The present invention will be described in detail below based on examples. However, the present invention is not limited to the examples.

Comparative Example 1

Three types of (boron-doped p-type) silicon wafers were prepared by subjecting silicon wafers to different treatments; one of which was a wafer that had been annealed at high temperature in a contaminated oven to be intentionally contaminated ("intentionally contaminated wafer"), another of which was mirror-polished wafer ("polished wafer"), and the other of which was a wafer that had been subjected neither to annealing, nor mirror polishing ("etching wafer"). Each of the wafers was treated with HF, left standing for 24 hours, and subjected to the SPV measurement. A map of the Fe concentration at the time is shown in FIGS. 1(a)-1(c).

Example 1

Each of the wafers that had been subjected to the SPV measurement in Comparative Example 1 was left standing for one week, retreated with HF, and immersed for 5 seconds in a vat filled with a diluted solution of p-tert-octylphenoxy polyethyl (a carbon-containing compound). The wafers were then dried with an $N_2$ purge. The diluted solution was obtained by diluting the original solution 1,000-fold with water. The original solution was a mixed solution comprising 25 to 30 weight percent of p-tert-octylphenoxy polyethyl, 30 to 40 weight percent of water, and 37 weight percent of ethylene glycol. Following the above-described treatment, the surfaces of the wafers were irradiated for 45 seconds with ultraviolet radiation (wavelength 185-254 nm, approximate intensity 8 mW) in an oxygen-containing atmosphere (air), and immediately subjected to SPV measurement. The energy of the ultraviolet radiation was 647 kJ/mol at a wavelength of 185 nm and 472 kJ/mol at a wavelength of 254 nm. Band bending measured in the vicinity of the wafer surface in this state with a model FAaST 330 made by SDI for oxide film measurement (non-contact C-V measurement) was about 0.2 V. In this case, the charge level of the wafer surface could be considered to be roughly identical to the above measured value because the oxide film was a thin 1 to 3 nm. An oxide film about 1 to 3 nm in thickness was formed on the wafer surface. FIGS. 2(a)-2(c) show a map of Fe concentration at that time. Less than one hour was required between HF treatment and the start of SPV measurement. Table 1 gives the respective values of diffusion length at the center prior to photodissociation. As is indicated by Table 1, no significant difference was seen in diffusion length between Example and Comparative Example. From these results, it was found that irradiation with ultraviolet radiation in an oxygen-containing atmosphere following deposition of a carbon-containing compound rapidly stabilized the surfaces of the surface-treated silicon wafers and yielded highly reliable data.

Comparative Example 2

Differences in the Fe concentration maps obtained when polished wafers similar to those in Comparative Example 1 were subjected to SPV measurement 1 hour and 24 hours after HF treatment are shown in FIGS. 3(a)-3(b). Table 2 shows the dependence on time elapsed from pretreatment of the diffusion length at the center of the wafer.

As shown in FIGS. 3(a)-3(b), measurement error increased and the number of locations where no Fe concentration was indicated increased when measurement was conducted with the surface in an unstable state. By contrast, in FIGS. 2(a)-2(c), there are not many more spots at which no Fe concentration appeared than in FIGS. 1(a)-1(c), and although the time between surface treatment and measurement was short, the wafer surface was thought to have stabilized. Further, from the comparison with Table 2, the diffusion length measured in Example 1 was determined to have been measured after the wafer surface had adequately stabilized.

TABLE 1

Diffusion length at the center of wafer prior to photodissociation

|  | Intentionally contaminated wafer | Polished wafer | Etching wafer |
| --- | --- | --- | --- |
| Comparative Example 1 | 424.9 | 514.4 | 501.1 |
| Example 1 | 409.2 | 516.1 | 507.1 |

TABLE 2

Dependence on time elapsed from HF treatment of the diffusion length at the center of the wafer

| Time elapsed from pretreatment | Diffusion length |
| --- | --- |
| 0 hr | 649.2 |
| 1 hr | 644.4 |
| 2 hr | 639.0 |
| 3 hr | 630.2 |
| 4 hr | 626.4 |
| 5 hr | 610.2 |
| 6 hr | 602.0 |
| 7 hr | 598.5 |
| 8 hr | 583.8 |
| 8 hr | 572.0 |
| 9 hr | 549.5 |
| 11 hr | 538.2 |
| 14 hr | 530.0 |
| 24 hr | 520.0 |
| 25 hr | 520.2 |

The present invention permits the rapid and highly reliable measurement of the concentration of contaminant metals in silicon wafers.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

Further, when an amount, concentration, or other value or parameter, is given as a list of upper preferable values and lower preferable values, this is to be understood as specifically disclosing all ranges formed from any pair of an upper preferred value and a lower preferred value, regardless whether ranges are separately disclosed.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A method of measuring a diffusion length of a minority carrier in a silicon wafer by a surface photovoltage method comprising:
    surface-treating the silicon wafer with hydrofluoric acid;
    depositing a carbon-containing compound on the surface of the silicon wafer that has been surface-treated; and
    irradiating the surface-treated silicon wafer with ultraviolet radiation wherein said irradiating takes place in an oxygen-containing atmosphere, wherein the silicon wafer after the irradiation with ultraviolet radiation has an oxide film on its surface formed during the irradiation with the ultraviolet radiation; and
    measuring the diffusion length of the minority carrier in the silicon wafer by the surface photovoltage method.

2. The method of measuring of claim 1, wherein the oxide film has a thickness ranging from approximately 1 to approximately 3 nm.

3. The method of measuring of claim 1, wherein the ultraviolet radiation has a wavelength ranging from approximately 100 to approximately 380 nm.

4. The method of measuring of claim 1, wherein the ultraviolet radiation has an energy/mol ranging from approximately 100 to approximately 800 kJ/mol.

5. The method of measuring of claim 1, wherein the silicon wafer is a p-type silicon wafer.

6. The method of measuring of claim 1, wherein the silicon wafer is doped with boron and comprises a contaminant metal in the form of iron.

7. The method of measuring of claim 1, wherein an oxygen concentration of the oxygen-containing atmosphere ranges from approximately 5 to approximately 100 volume percent.

8. The method of measuring of claim 1, wherein said surface treatment occurs in the oxygen-containing atmosphere.

9. A method of manufacturing a silicon wafer, comprising:
    surface-treating a silicon wafer,
    measuring a diffusion length of a minority carrier in the surface-treated silicon wafer by a surface photovoltage method comprising irradiating the surface-treated silicon wafer with ultraviolet radiation in an oxygen-containing atmosphere, wherein the silicon wafer after the irradiation with ultraviolet radiation has an oxide film on its surface formed during the irradiation with the ultraviolet radiation, and measuring the diffusion length of the minority carrier in the silicon wafer,
    calculating a concentration of contaminant metal from the measured diffusion length of the minority carrier, and
    selecting the silicon wafer of which a concentration of contaminant metal that has been calculated is equal to or less than a target values.

* * * * *